United States Patent
Konishi et al.

(10) Patent No.: US 10,049,951 B2
(45) Date of Patent: Aug. 14, 2018

(54) BONDED SUBSTRATE, METHOD FOR MANUFACTURING THE SAME, AND SUPPORT SUBSTRATE FOR BONDING

(71) Applicant: Shin-Etsu Chemical Co., Ltd., Chiyoda-ku, Tokyo (JP)

(72) Inventors: Shigeru Konishi, Annaka (JP); Makoto Kawai, Annaka (JP)

(73) Assignee: Shin-Etsu Chemical Co., Ltd., Tokyo (JP)

(*) Notice: Subject to any disclaimer, the term of this patent is extended or adjusted under 35 U.S.C. 154(b) by 0 days.

(21) Appl. No.: 15/515,161

(22) PCT Filed: Sep. 30, 2015

(86) PCT No.: PCT/JP2015/077687
§ 371 (c)(1),
(2) Date: Mar. 29, 2017

(87) PCT Pub. No.: WO2016/052597
PCT Pub. Date: Apr. 7, 2016

(65) Prior Publication Data
US 2017/0221786 A1 Aug. 3, 2017

(30) Foreign Application Priority Data
Sep. 30, 2014 (JP) .................... 2014-200770

(51) Int. Cl.
*H01L 23/58* (2006.01)
*H01L 23/14* (2006.01)
(52) U.S. Cl.
CPC .................... *H01L 23/147* (2013.01)
(58) Field of Classification Search
CPC ... H01L 23/147; H01L 23/15; H01L 21/0242; H01L 21/2007

(Continued)

(56) References Cited

U.S. PATENT DOCUMENTS 4,781,970 A * 11/1988 Barbee .................. C03C 17/225
106/287.16
5,034,357 A * 7/1991 Yamakawa ........... C04B 35/581
257/E23.009

(Continued)

FOREIGN PATENT DOCUMENTS

JP 2001-64080 A 3/2001
JP 2009-200279 A 9/2009

(Continued)

OTHER PUBLICATIONS

International Search Report (PCT/ISA/210) issued in PCT Application No. PCT/JP2015/077687 dated Jan. 12, 2016 with English translation (5 pages).

(Continued)

*Primary Examiner* — Nitin Parekh
(74) *Attorney, Agent, or Firm* — Crowell & Moring LLP

(57) ABSTRACT

A method for manufacturing a bonded substrate is provided, the bonded substrate including a single-crystal semiconductor substrate on a sintered-body substrate that has small warpage after bonding, has good thermal conductivity and small loss at high-frequency region and is suitable for high-frequency devices. Specifically, the method at least includes: applying coating to all of the faces of a sintered-body substrate, so as to obtain a support substrate including at least one layer of amorphous film; and bonding the support substrate and a single-crystal semiconductor substrate via the amorphous film. On a surface of the amorphous film on the support substrate to be bonded with the single-crystal semiconductor substrate, concentration of each of Al, Fe and Ca by ICP-MS method is less than $5.0 \times 10^{11}$ atoms/$cm^2$, and surface roughness Rms of the surface of the amorphous film is 0.2 nm or less.

7 Claims, 1 Drawing Sheet

(58) Field of Classification Search
USPC .................................. 257/507, 632, 783, 701
See application file for complete search history.

(56) References Cited

U.S. PATENT DOCUMENTS

| | | | | |
|---|---|---|---|---|
| 5,213,877 | A * | 5/1993 | Yoshida | C04B 41/009 |
| | | | | 228/121 |
| 6,100,166 | A * | 8/2000 | Sakaguchi | B28D 5/00 |
| | | | | 257/E21.088 |
| 6,391,812 | B1 | 5/2002 | Araki et al. | |
| 6,558,821 | B1 * | 5/2003 | Shinosawa | B24B 1/00 |
| | | | | 257/E23.009 |
| 2002/0164475 | A1 * | 11/2002 | Imamura | C01B 21/068 |
| | | | | 428/325 |
| 2004/0126598 | A1 * | 7/2004 | Tanaka | C04B 35/581 |
| | | | | 428/469 |
| 2009/0212384 | A1 | 8/2009 | Kobayashi et al. | |
| 2010/0193900 | A1 | 8/2010 | Ohmi et al. | |
| 2013/0309843 | A1 | 11/2013 | Akiyama et al. | |
| 2014/0124700 | A1 * | 5/2014 | Yamamoto | C04B 35/581 |
| | | | | 252/71 |
| 2014/0327116 | A1 | 11/2014 | Konishi et al. | |
| 2015/0137238 | A1 | 5/2015 | Tsunemi et al. | |

FOREIGN PATENT DOCUMENTS

| | | |
|---|---|---|
| JP | 2010-278160 A | 12/2010 |
| WO | WO 2009/011152 A1 | 1/2009 |
| WO | WO 2013/094665 A1 | 6/2013 |
| WO | WO 2013/118618 A1 | 8/2013 |

OTHER PUBLICATIONS

Japanese-language Written Opinion (PCT/ISA/237) issued in PCT Application No. PCT/JP2015/077687 dated Jan. 12, 2016 (3 pages).
Japanese-language Office Action issued in counterpart Japanese Application No. 2014-200770 dated Nov. 24, 2016 with English translation (5 pages).
English translation of document C2 (Japanese-language Written Opinion (PCT/ISA/237) dated Jan. 12, 2016) previously filed on Mar. 29, 2017 (four pages).
Extended European Search Report issued in counterpart European Application No. 15845835.6 dated May 3, 2018 (10 pages).

* cited by examiner

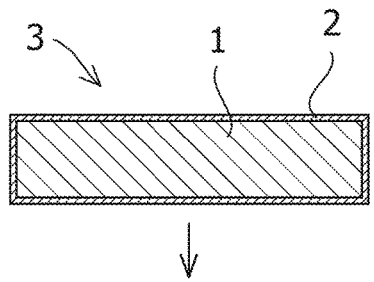
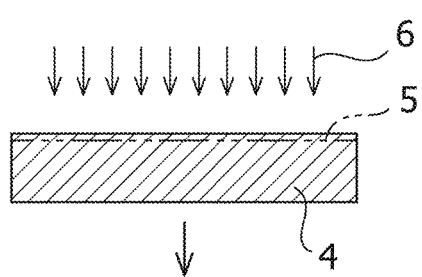
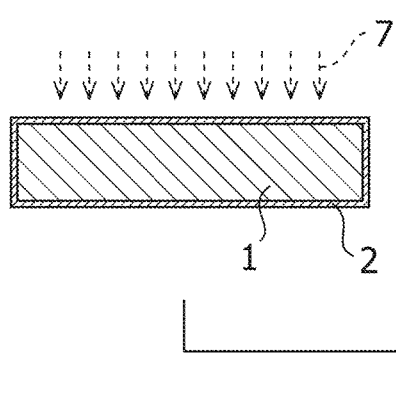
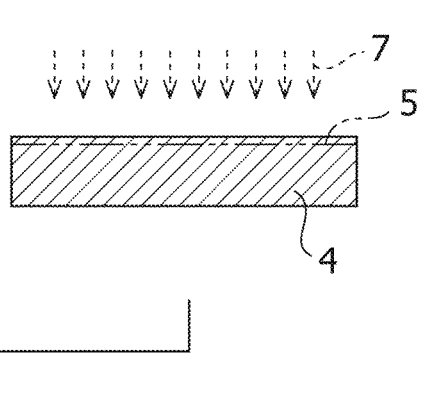
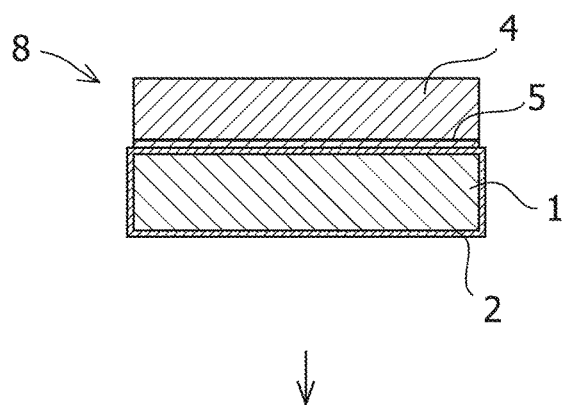
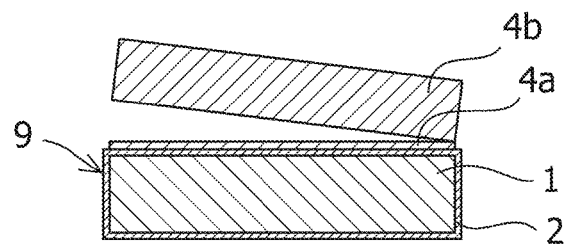

BONDED SUBSTRATE, METHOD FOR MANUFACTURING THE SAME, AND SUPPORT SUBSTRATE FOR BONDING

TECHNICAL FIELD

The present invention relates to a bonded substrate including a single-crystal semiconductor layer on a support substrate, and more particularly relates to a bonded substrate including a single-crystal silicon layer having a semiconductor device layer that is mainly for high-frequency applications on an insulating sintered-body substrate made of silicon nitride or aluminum nitride having high thermal conductivity.

BACKGROUND ART

Recent silicon-based semiconductor devices increasingly have more improved performance due to their miniaturized design rules. A substrate used for these devices mainly includes a SOI (Silicon on Insulator) substrate. This SOI substrate enables small junction capacitance and suppression of leak current of a semiconductor device, and has good high-frequency characteristics, and so is suitable for the applications of power devices and high-frequency devices.

A SOI substrate is typically manufactured by a SIMOX (Separation by IMplantation of OXygen) method or a bonding method. The SIMOX method is to implant oxygen ions at high concentration in a silicon substrate as semiconductor, followed by heat treatment at high temperatures, so as to form an oxide film as an insulator in the substrate to be a SOI substrate. The bonding method is to bond a silicon substrate as semiconductor and a support substrate as insulator, followed by thinning of the silicon substrate to form a SOI substrate. A support substrate of the SOI substrate typically is an insulating substrate only. For some applications, however, a substrate made of semiconductor or insulator at least having an insulating layer at the surface part including a silicon layer of the support substrate also can be used. In this case, the insulating layer and the insulating substrate may be made of the same material or different materials.

The SOI substrate is used for a transferring substrate as well. The transferring substrate is used for manufacturing of a backside illumination-type CMOS (Complementary Metal Oxide Semiconductor) sensor (Patent document 1), a high-frequency semiconductor device (Patent document 2) and the like. The backside illumination-type CMOS can be manufactured as follows, for example. After a semiconductor device layer is formed in a silicon layer of a SOI substrate, the semiconductor device layer and a silicon substrate as another substrate for supporting are bonded. Then, the insulating substrate part or a part of the insulating substrate part and a part of the silicon layer of the SOI substrate, which are on the back side of the semiconductor device layer bonded to the silicon substrate, are removed by means such as back grinding, polishing, or etching so as to bring the silicon layer at the surface. Then, a color filter and an on-chip lens are formed on this silicon layer to form a backside illumination-type CMOS. The above-stated means such as back grinding used for removal of the insulating substrate part or a part of the insulating substrate part and a part of the silicon layer of the SOI substrate is means used for manufacturing of a backside illumination-type solid-state imaging devices. Similarly for high-frequency semiconductor devices, a SOI substrate is used for transferring a high-frequency semiconductor device layer into another support substrate.

PRIOR ART DOCUMENTS

Patent Documents

Patent document 1: Japanese Patent No. 5286820
Patent document 2: WO 2013/118618

SUMMARY OF THE INVENTION

Problems to be Solved by the Invention

For a transferring substrate, silicon or glass of low cost is typically used instead of the SOI substrate. However, since silicon has large loss at a high-frequency region, loss tends to occur for high-frequency devices. Since glass has low thermal conductivity, the substrate may hardly dissipate heat. The use of a SOS (Silicon on Sapphire) substrate including sapphire as the support substrate may be considered because sapphire has higher thermal conductivity than glass. However, since a sapphire substrate has a significant difference in thermal expansion with silicon, warpage often occurs. Since such warpage occurring is large, it is not suitable as a substrate for transferring in some cases. Therefore a substrate suitable for a substrate for transferring that generates less warpage after bonding, is at low cost and has good thermal conductivity has been desired.

Since recent devices have high power and high integration, the amount of heat generation from transistors and metal wiring connecting the transistors increase. Therefore a SOI substrate is required to have improved heat dissipation capacity. To improve heat dissipation capacity, it is being studied that a silicon layer including a device formed therein is thinned to about a hundred to a few hundreds of μm from the back side, and a large fan also is attached on the device to promote heat dissipation, and water-cooling tube may be arranged around a device for cooling. Even after thinning, however, the silicon layer is a hundred to a few hundreds of μm, and the region to form a device is only about a few μm from the surface. The remaining region has large loss at a high-frequency region because of a dielectric property of silicon, and so it acts as a heat bank. As a result, the heat dissipation capacity of the device may not be improved. When a SOI substrate is used for high-performance processors, it has a structure having an insulating layer made of $SiO_2$ immediately below a semiconductor device layer of silicon. In this case, since $SiO_2$ has low thermal conductivity of 1.38 W/m·K, it may dissipate less heat.

In contrast, a SOS substrate has properties of having good thermal conductivity and having small loss at a high-frequency region. A sapphire substrate used for a support substrate, however, has a significant difference in thermal expansion with silicon, and so warpage often occurs during heat treatment or film formation. Since such warpage occurring is large, it is difficult to increase the size of the substrate, and so the cost may increase. Further, since a sapphire substrate is transparent in a visible light region, an optical sensor, which is used to check the presence of a support substrate or to position a wafer, may not respond to the sapphire substrate.

Examples of a material for a support substrate of a SOI substrate that is not transparent to visible light, has good thermal conductivity, and is low cost include inorganic sintered body (ceramics), such as silicon nitride or aluminum nitride. Since an inorganic sintered-body substrate (hereinafter called a sintered-body substrate) has a smaller difference in thermal expansion with silicon than that of a sapphire substrate, less warpage occurs than in a SOS substrate when a bonded substrate is formed. Since such warpage if occurring is small, it is easy to increase the size.

However, since a sintered-body substrate is manufactured by sintering silicon nitride powder or aluminum nitride powder with sintering aids, the surface roughness of the substrate is greater than that of a single-crystal substrate such as sapphire or silicon, or a glass substrate. Therefore, it is difficult to bond this substrate as it is with a silicon substrate, or a bonded substrate cannot be manufactured in some cases.

Raw-material powder of a sintered-body substrate may include metal such as iron or calcium as impurities. Aluminum may be used as raw-material powder or may be included in a sintered-body substrate because alumina is used as a sintering aid. These metal impurities and aluminum are diffused from the surface of the substrate during manufacturing of a device, and they may contaminate the process line.

From the above, the present invention aims to provide a method for manufacturing a bonded substrate, including a single-crystal semiconductor layer to form a semiconductor device layer on a sintered-body substrate, the sintered-body substrate being opaque to visible light, having high thermal conductivity, low loss at a high-frequency region and small warp, and being at a low cost. The present invention aims to provide a sintered-body substrate for bonding, capable of reducing diffusion of metals and metal impurities included in a substrate that might contaminate a process line during manufacturing of the device, and having a smooth surface suitable for bonding with a silicon substrate. The present invention aims to provide a bonded substrate and a support substrate for bonding suitable for a substrate for transferring. That is, they can facilitate removal of the insulating substrate part or a part of the insulating substrate part and a part of the silicon layer of a SOI substrate from the rear face of a semiconductor device layer by back grinding or the like.

Means for Solving the Problems

In view of the circumstances, the present inventors found that, when a sintered-body substrate is used as a support substrate of a SOI substrate, an amorphous film is formed on all of the faces of the sintered-body substrate so as to fill the depressions on the surface, whereby diffusion of metals and metallic impurities from the substrate, which might contaminate the process line during the manufacturing the device, can be reduced. The present inventors further found that polishing of the surface of the amorphous film as needed can lead to the manufacturing of a support substrate for bonding having surface roughness suitable for bonding with a silicon substrate. The present inventors further found that the obtained support substrate for bonding and a single-crystal semiconductor substrate are bonded, whereby a bonded substrate with less warpage and reduced voids at the bonding interface can be obtained.

That is, according to one aspect of the present invention, a method for manufacturing a bonded substrate is provided, and the method at least includes: applying coating to all of the faces of a sintered-body substrate, so as to obtain a support substrate including at least one layer of amorphous film; and bonding the support substrate and a single-crystal semiconductor substrate via the amorphous film. On a surface of the amorphous film on the support substrate to be bonded with the single-crystal semiconductor substrate, concentration of each of Al, Fe and Ca by ICP-MS method is less than $5.0\times10^{11}$ atoms/cm$^2$, and surface roughness Rms of the surface of the amorphous film is 0.2 nm or less.

According to another aspect of the present invention, a support substrate for bonding is provided, and includes a sintered-body substrate and at least one layer of amorphous film disposed on all of the faces of the sintered-body substrate. On a surface of the amorphous film, concentration of each of Al, Fe and Ca by ICP-MS method is less than $5.0\times10^{11}$ atoms/cm$^2$, and surface roughness Rms of the surface of the amorphous film is 0.2 nm or less.

According to another aspect of the present invention, a bonded substrate is provided, and includes: a sintered-body substrate; at least one layer of amorphous film disposed on all of the faces of the sintered-body substrate, and a single-crystal semiconductor layer disposed on the amorphous film. On a surface of the amorphous film on which the single-crystal semiconductor layer is disposed, concentration of each of Al, Fe and Ca by ICP-MS method is less than $5.0\times10^{11}$ atoms/cm$^2$, and surface roughness Rms of the surface of the amorphous film is 0.2 nm or less.

Advantageous Effects of the Invention

According to the present invention, at least one layer of amorphous film is formed on the surface of a sintered-body substrate to be bonded to a single-crystal semiconductor substrate. Thereby, when such a sintered-body substrate is used as a support substrate, the surface of the substrate can have favorable smoothness, and the support substrate can be a support substrate for bonding suitable for bonding with a single-crystal semiconductor substrate. Since the obtained support substrate for bonding has the amorphous film on all of the faces, this can reduce or eliminate diffusion of metals and metallic impurities from the substrate to the outside, and so the contamination of process line during the manufacturing of a device can be suppressed. When such a support substrate for bonding is bonded with a single-crystal semiconductor substrate, a bonded substrate obtained has small warpage and reduced voids at the bonding interface. Since such a bonded substrate includes a thin amorphous film on the surface of the sintered-body substrate, it has good thermal conductivity and small loss at a high-frequency region, and so is suitable for high-frequency devices. Such a bonded substrate and a support substrate for bonding can be used as a substrate for transferring as well, and the substrate for transferring can be used in manufacturing of a backside illumination-type CMOS sensor, a high-frequency semiconductor device and the like. Since it has small warpage, when it is used as a substrate for transferring, the substrate for transferring can be removed easily by back grinding or the like.

BRIEF DESCRIPTION OF THE DRAWINGS

FIG. 1A to FIG. 1F schematically show one aspect of the manufacturing step of a bonded substrate according to the present invention.

MODE FOR CARRYING OUT THE INVENTION

According to one embodiment, the present invention relates to a method for manufacturing a bonded substrate including a single-crystal semiconductor layer on a support substrate via a film. The method at least includes: applying coating over all of the faces of a sintered-body substrate to obtain a support substrate including at least one layer of amorphous film; and bonding the support substrate and a single-crystal semiconductor substrate via the amorphous film. The surface of the amorphous film on the support substrate to be bonded to the single-crystal semiconductor substrate has concentration of Al, Fe and Ca of less than $5.0 \times 10^{11}$ atoms/cm$^2$ by the ICP-MS method, and has surface roughness Rms of 0.2 nm or less.

According to another embodiment, the present invention relates to a support substrate for bonding, including an amorphous film on the surface of a support substrate. That is, this embodiment of the present invention relates to a support substrate for bonding including a sintered-body substrate and at least one layer of amorphous film disposed on each face of the sintered-body substrate, and the surface of the amorphous film has concentration of Al, Fe and Ca of less than $5.0 \times 10^{11}$ atoms/cm$^2$ by the ICP-MS method, and has surface roughness Rms of 0.2 nm or less.

The single-crystal semiconductor substrate preferably includes a single-crystal silicon substrate.

The sintered-body substrate preferably includes an insulating inorganic sintered body (ceramic) substrate. A sintered body is obtained by heating aggregate of inorganic powder at a temperature lower than the melting point of the inorganic substance making up the aggregate for solidification. For instance, raw-material powder (e.g., silicon nitride or aluminum nitride) of 0.1 to 50 μm in average size is shaped into a plate form by metallic molding, cold isostatic pressing, a doctor blade method or the like, followed by heating under atmospheric conditions or under a nitrogen atmosphere. For instance, in the case of silicon nitride, heating is performed at 1400 to 2000° C., whereby a sintered-body substrate can be manufactured. When pressure is required during shaping by metallic molding, cold isostatic pressing or the like, the pressure is preferably 100 MPa or more. In some cases, sintering aids, such as alumina, magnesia and yttria, may be added to promote sintering and stabilize the shape. Although the dimensions of the sintered-body substrate are not especially limited, they are preferably 150 to 300 mm in outer diameter and 500 to 1000 μm in thickness. Since a sintered-body substrate is opaque to visible light, an optical sensor, which is used to check the presence of a support substrate or to position a wafer, can detect the sintered-body substrate. A sintered-body substrate has good thermal conductivity and a smaller difference in thermal expansion with silicon than that of a sapphire substrate, so less warpage occurs when a bonded substrate is formed. Since such warpage, if it occurs, is small, it is easy to increase the size. Examples of the insulating sintered-body substrate include silicon nitride (Si$_3$N$_4$), aluminum nitride (AlN) or sialon (silicon alumina nitride, Si$_{6-x}$Al$_x$O$_x$N$_{8-x}$ (X denotes a number exceeding 0 and 4 or less). Sialon is prepared by forming solid solution of alumina (Al$_2$O$_3$) with silicon nitride (Si$_3$N$_4$), and is Si$_3$N$_4$-based engineering ceramic. For materials of the sintered-body substrate, a material including silicon nitride as a major material is most preferable because it has high resistance to chemicals used during the manufacturing process of a device, and is low cost.

Desirably, the sintered-body substrate has thermal conductivity higher than 1.5 W/m·K that is thermal conductivity of SiO$_2$, for example. Preferably the thermal conductivity of the sintered-body substrate is 5.0 W/m·K or more, more preferably 10 W/m·K or more and much preferably 100 W/m·K or more. If thermal conductivity is less than 5.0 W/m·K, the substrate has low heat dissipation capacity, and may not be suitable for semiconductor devices. Thermal conductivity can be measured by a laser flash method and a method complying with ASTM5470, for example.

Volume resistivity of the sintered-body substrate is preferably $1.0 \times 10^8$ Ω·cm or more, and more preferably $1.0 \times 10^{10}$ Ω·cm or more. If volume resistivity is less than $1.0 \times 10^8$ Ω·cm, it is difficult for a device including a bonded substrate made up of such a sintered-body substrate to suppress electrical loss due to the dielectric characteristics. Volume resistivity can be measured by four-terminal sensing or two-terminal sensing, for example.

Linear coefficient of expansion of the sintered-body substrate is preferably $5.0 \times 10^{-6}$/° C. or less, more preferably $2.0 \times 10^{-6}$ to $4.0 \times 10^{-6}$/° C. If the linear coefficient of expansion is more than $5.0 \times 10^{-6}$/° C., when heat of 200° C. or more is applied to a bonded substrate thereof, the bonded substrate may warp or break because there is a large difference in coefficient of thermal expansion with silicon. The linear coefficient of expansion can be measured by thermo-mechanical analysis, for example.

The sintered-body substrate includes metals as raw materials (e.g., silicon or aluminum), sintered aids or binder such as alumina, or metallic impurities such as iron or calcium. Aluminum and metallic impurities such as iron or calcium may be diffused from the sintered-body substrate to a single-crystal silicon layer when a single-crystal silicon substrate is directly bonded to the sintered-body substrate. These metals and metal impurities may be diffused to and contaminate devices used during the steps of manufacturing a bonded substrate and during the following steps of manufacturing a semiconductor device. When the sintered-body substrate is used for the process of manufacturing semiconductor devices, it is important to avoid diffusion of these metals and metal impurities from the surface of the substrate or to suppress the diffusion so as not to adversely affect the process.

Concentration of metals on the surface of a sintered-body substrate is typically evaluated by collecting components to be evaluated on the surface of the substrate and measuring the same by an ICP-MS method (inductively Coupled Plasma-Mass Spectrometry). Metallic components to be evaluated are collected by immersing a sintered-body substrate into a HF aqueous solution (50% by mass) or by applying a constant amount of the solution to the entire surface of the sintered-body substrate by a mist method, for example, so as to dissolve the metallic components on the substrate surface into the HF aqueous solution. The permissible concentration of metals may depend on the process used, and this is preferably less than $5.0 \times 10^{11}$ atoms/cm$^2$, more preferably less than $1.0 \times 10^{11}$ atoms/cm$^2$ in the process of joining and transferring a semiconductor device. In the process of making a bonded substrate and then forming a device, the permissible concentration of metal is preferably less than $2.0 \times 10^{10}$ atoms/cm$^2$, more preferably less than $1.0 \times 10^{10}$ atoms/cm$^2$. In the case of silicon nitride sintered-body substrate, major metallic impurities are aluminum, iron and calcium, which may depend on the types of silicon nitride powder and the types of binder used for manufacturing of a substrate, and the concentration of metallic impurities is typically $1.0 \times 10^{13}$ atoms/cm$^2$ or more.

The sintered-body substrate is obtained by shaping powder and sintering the same as stated above. The sintered-body substrate therefore has a large number of depressions of about 0.01 to 2.0 μm in diameter and about 0.05 to 1.0 μm in depth on the surface of the substrate, and has large surface roughness compared with a single-crystal substrate such as sapphire or silicon or a glass substrate. The diameter and depth of the depressions on the surface of the substrate can be evaluated using an Atomic Force Microscope (AFM), a white-light microscope (ZYGO), or the like.

Considering them, coating is applied to all of the faces of the sintered-body substrate, whereby a support substrate including at least one layer of amorphous film can be obtained. Such a film is desirably made of amorphous film, because it can fill the depressions on the surface of the sintered-body substrate without gaps and the substrate can have surface roughness suitable for bonding with a single-crystal semiconductor substrate. The amorphous film may be of a type that is typically used for the process of manufacturing semiconductor devices, and is preferably selected from $SiO_2$, $Si_3N_4$, $SiO_xN_y$ (x and y are numbers satisfying 0<x<2.0, 0<y<1.3), amorphous silicon, and amorphous polysilicon, for example. Especially $Si_3N_4$ is preferable because it can suppress diffusion of metals and metallic impurities from the sintered-body substrate and the film itself has high thermal conductivity. A method for forming the amorphous film is not especially limited. For instance, the amorphous film may be manufactured by deposition such as CVD (chemical vapor deposition) and PVD (physical vapor deposition), or immersion of a substrate into solution of organic metallic precursor including metal to form an amorphous film. The amorphous film may be manufactured by coating all of the faces of a substrate or at least a face to be bonded with a single-crystal semiconductor substrate with organic metallic precursor, followed by heating to remove organic substance to form an amorphous film. When CVD is used, a $Si_3N_4$ film can be formed by using mixture gas of $SiCl_2H_2$ and $NH_3$ ($SiCl_2H_2$:$NH_3$=1:0.1 to 1:200 in volume ratio) at atmospheric pressure and at 800 to 1000° C., for example. A $SiO_2$ film may be formed by using a gas mixture of $SiH_4$ and $O_2$ ($SiH_4$:$O_2$=1:0.1 to 1:100 in volume ratio) as atmospheric gas and at 600 to 1000° C., for example. A $SiO_xN_y$ film (0<x<2.0, 0<y<1.3) may be formed by using a gas mixture of tetraethyl orthosilicate (TEOS, $Si(OC_2H_5)_4$), $NH_3$ and $O_2$ (1:0.1:0.5 to 1:10:5 in volume ratio) as atmospheric gas and at 500 to 1000° C., for example. In order to obtain desired surface roughness, after the step of forming a support substrate including at least one layer of amorphous film, polishing may be performed at least to the surface of the amorphous film to be bonded with the single-crystal semiconductor substrate by CMP (Chemical Mechanical Polishing) or the like, so as to make the surface of the film smoother. The amorphous film may be disposed on all of the faces of the sintered-body substrate. The amorphous film is effective not only for smoothing the surface of the sintered-body substrate, but also for preventing diffusion of Al included in the sintered-body substrate, Fe, Ca or the like as metallic impurities to a semiconductor device layer or a single-crystal silicon layer. Due to such an amorphous film disposed on all of the faces of the sintered-body substrate, the sintered-body substrate is coated with the amorphous film not only at the face to be bonded with a single-crystal semiconductor substrate but also at the lateral faces and the rear face. Therefore cross contamination to the devices used during the steps of manufacturing a bonded substrate and the following steps of manufacturing a semiconductor device can be effectively prevented.

The amorphous film disposed on the surface of the sintered-body substrate may be at least one layer, which may be a single layer or multiple layers of two or more. When the amorphous film includes multiple layers of two or more, the types of the films in each layer may be selected from the materials as stated above. The types of the film may be different for each layer, or may be the same, and may be manufactured by the above-stated method. Thickness of each layer may be the same or be different. For instance, coating may be applied to all of the faces of the sintered-body substrate to form a $SiO_2$ film, followed by coating of the $SiO_2$ film to form a $Si_3N_4$ film thereon. In this way, when the types of the amorphous film are different between the first layer and the second layer, the surface of the sintered-body substrate can be covered more densely, which can prevent diffusion of metallic components from the substrate more favorably.

For the amorphous film disposed on the surface of the sintered-body substrate, the type of the film and the thickness can be selected by the following method, for example.

Thermal conductivity in the direction perpendicular to the surface of the sintered-body substrate having an amorphous film, i.e., in the thickness direction of the amorphous film, can be represented using overall heat transfer coefficient U ($W/m^2·K$). A larger value of the overall heat transfer coefficient U means better thermal conductivity. For instance, the reciprocal of the overall heat transfer coefficient U in the thickness direction of the support substrate having amorphous film including M layers can be represented by the following expression:

$$1/U = \Sigma Li/\lambda i (i=1, \ldots, M) \qquad (I),$$

where Li (m) denotes the thickness of the i-th layer (i=1, . . . , M) and λi (W/m·K) denotes thermal conductivity of the i-th layer. In the above expression (I), since thermal conductivity is evaluated by directly coming a heat-transfer pair into the surface to be evaluated, L/λ of the support substrate itself included in a typical expression, the coefficient of heat transfer around the substrate, and the fouling factor are excluded because they are smaller by two orders of magnitude than the coefficient of transfer of the amorphous film in thickness direction. The reciprocal of the overall heat transfer coefficient U increases with the thickness of the amorphous film. Therefore a thinner amorphous film is desirable so that the reciprocal of the overall heat transfer coefficient of the amorphous film in thickness direction has a small variation to be 50 to 98% of the reciprocal of the overall heat transfer coefficient of the sintered-body substrate in thickness direction without the amorphous film, for example. Thermal conductivity of the amorphous film can be evaluated by forming an amorphous film of the same type and the same thickness as those formed on the sintered-body substrate on a substrate (e.g., single-crystal Si or $SiO_2$) as an index, and measuring this index substrate in the direction perpendicular to the surface having the amorphous film using a thermophysical property microscope (e.g., TM3 produced by Bethel Co., Ltd.). The overall transfer coefficient of the sintered-body substrate without an amorphous film can be calculated based on the thermal conductivity that is measured by a laser flash method and a method complying with ASTM5470, for example, and the thickness of the substrate.

As stated above, the surface of the sintered-body substrate has a large number of depressions, such as holes due to grain boundary. Therefore, a thicker amorphous film may be formed on the substrate so as to allow the surface of the sintered-body substrate to have desired surface roughness. The film formed, however, has an amorphous structure, and so has low thermal conductivity. Therefore a thicker film means low thermal conductivity of the substrate as a whole including the amorphous film. For instance, when a bonded substrate obtained by bonding with a single-crystal semiconductor substrate is used as a high-frequency device, thermal conductivity of the support substrate before bonding with the single-crystal semiconductor substrate desirably is higher than that of sapphire (42 W/m·K) as the support substrate of a SOS substrate from the viewpoint of obtaining more excellent heat dissipation capacity than the SOS substrate that is typically used for high-frequency devices.

As a result of the study by the present inventors on the support substrate having desired characteristics, it was found that the type and thickness of amorphous film are selected so that the reciprocal of the overall heat transfer coefficient in the direction perpendicular to the surface of the sintered-body substrate having the amorphous film, i.e., in the thickness direction of the amorphous film is 50 to 98% of the reciprocal of the overall heat transfer coefficient of the sintered-body substrate in the thickness direction without an amorphous film, whereby a sintered-body substrate including an amorphous film having both of the heat dissipation capacity and surface smoothness can be obtained. In this case, the thickness of the amorphous film preferably exceeds 0.1 µm and less than 10 µm, more preferably exceeds 0.1 µm and 1.0 µm or less. When the amorphous film includes multiple layers of two or more, the total of the thicknesses of all layers formed on the sintered-body substrate preferably exceeds 0.1 µm and less than 10 µm. If the thickness is less than 0.1 µm, filling of depressions on the surface of the sintered-body substrate is not sufficient, and metals and metallic impurities in the substrate may diffuse to the outside of the substrate. If the thickness exceeds 10 µm, heat dissipation capacity deteriorates. In addition, the film often generates cracks, meaning that exposed parts are generated on the surface of the substrate, which leads to the possibility of diffusion of metals and metallic impurities in the substrate to the outside of the substrate. Especially when the amorphous film is $Si_3N_4$, the thickness of the amorphous film preferably exceeds 0.1 µm and 1 µm or less. The thickness of the amorphous film may be designed beforehand so that the thickness can be within the preferable range as stated above during the film formation, or may be adjusted after the film formation by polishing, etching or the like to be within the preferable range as stated above. The thickness of the amorphous film can be evaluated by forming an amorphous film of the same type and the same thickness as those formed on the sintered-body substrate on a substrate (e.g., single-crystal Si or $SiO_2$) as an index, and measuring the thickness using a film-thickness measuring instrument based on optical interferometry, for example. When the surface of the amorphous film is polished by CMP, for example, an amorphous film of the same type and the same thickness as those formed on the sintered-body substrate is formed on a substrate (e.g., single-crystal Si or $SiO_2$) as an index. Then, the amorphous film on the index substrate is polished under a constant polishing condition, and the thicknesses of the amorphous film before and after polishing are measured using a film-thickness measuring instrument based on optical interferometry, for example. As a result, the rate of the polishing can be calculated. The thickness can be set by controlling the polishing time based on the polishing rate.

According to the present invention, when an amorphous film of $Si_3N_4$ exceeding 0.1 µm and less than 10 µm in thickness is disposed on the surface of silicon nitride sintered body (thermal conductivity of 100 W/m·K), the reciprocal (1/overall heat transfer coefficient) in the thickness direction of the $Si_3N_4$ film on the silicon nitride sintered-body substrate can be suppressed to 50 to 98% of the reciprocal of the overall heat transfer coefficient in the thickness direction of the silicon nitride sintered-body substrate without the $Si_3N_4$ film, whereby thermal conductivity higher than that of a sapphire substrate can be obtained.

At least on the surface of the amorphous film on the support substrate to be bonded with a single-crystal semiconductor substrate, concentration of Al, Fe and Ca by ICP-MS method is less than $5.0 \times 10^{11}$ atoms/cm². If the concentration of metal is higher than $5.0 \times 10^{11}$ atoms/cm², these metal components diffused from the substrate surface may contaminate a single-crystal silicon layer of a bonded substrate thereof or may contaminate devices used during the steps of manufacturing the bonded substrate and during the following steps of manufacturing a semiconductor device. Therefore, a further step of selecting the support substrate having a concentration of Al, Fe and Ca less than $5.0 \times 10^{11}$ atoms/cm² by ICP-MS method may be included. If the concentration of metal is higher than $5.0 \times 10^{11}$ atoms/cm², a coating may be applied again to all of the faces of the sintered-body substrate so as to form another amorphous film. That is, if the evaluation on the surface of the amorphous film on the support substrate to be bonded with a single-crystal semiconductor substrate using the ICP-MS method shows that concentration of Al, Fe and Ca is $5.0 \times 10^{11}$ atoms/cm² or more, coating further may be applied to the surface of the support substrate already having at least one layer of amorphous film so as to form a support substrate having an amorphous film of at least two layers. In this case also, the thickness in total of all of the amorphous films preferably exceeds 0.1 µm and is less than 10 µm. The concentration of metals on the surface of the amorphous film can be evaluated by a method similar to the evaluation of the concentration of metals on the surface of a sintered-body substrate before forming the amorphous film.

At least the amorphous film on the support substrate to be bonded to a single-crystal semiconductor substrate preferably has surface roughness Rms of 0.2 nm or less. Such surface roughness Rms of 0.2 nm or less can lead to desired surface smoothness, and can suppress gaps, which may be the cause of void defects at the bonding interface when it is bonded to a single-crystal semiconductor substrate. The surface roughness Rms can be measured by using an Atomic Force Microscope (AFM), a white-light microscope (ZYGO), or the like.

By such a method, a support substrate including a sintered-body substrate and at least one layer of amorphous film disposed on all of the faces of the sintered-body substrate can be obtained. The obtained support substrate can be used as a support substrate for bonding and can be used as a transferring substrate that is used for manufacturing of a backside illumination-type CMOS sensor, a high-frequency semiconductor device and the like. When the support substrate is used as a support substrate for bonding or a transferring substrate, a semiconductor substrate or another insulating substrate may be bonded to the face of the sintered-body substrate including an amorphous film that is opposed to the face having the single-crystal semiconductor substrate obtained by the above-stated method.

Next, the support substrate and the single-crystal semiconductor substrate are bonded via the amorphous film. The method for manufacturing a bonded substrate including a single-crystal semiconductor layer by bonding is not especially limited. For instance, the method may be based on a SmartCut method and at least includes: bonding the surface of a single-crystal semiconductor substrate into which hydrogen ions are implanted from the surface to be bonded to the surface of the amorphous film on the support substrate; and applying heat treatment at 150° C. or more, preferably 250 to 500° C., to the bonded substrate so as to cause thermal delamination along the ion-implantation layer and transfer the single-crystal semiconductor layer to the support substrate via the amorphous film, thus obtaining a bonded substrate including a single-crystal semiconductor layer on the amorphous film. Another method for manufacturing such a bonded substrate may be based on a SiGen method and at least includes: applying surface-activation treatment by plasma treatment or the like to at least one or both of the surface of the amorphous film on a support substrate and the surface of a single-crystal semiconductor substrate into which hydrogen ions are implanted from the surface to be bonded; bonding the surface of the amorphous film on the support substrate and the surface of the single-crystal semiconductor substrate, at least one or both of which are subjected to the surface-activation treatment, to form a bonded substrate; applying heat treatment at low temperatures (e.g., 100 to 350° C.) so as to increase the bonding strength of the bonding interface so as to obtain a bonded member; and giving mechanical impact on the ion-implantation layer of the bonded member at room-temperature conditions without heating or cooling using a wedge or the like so as to cause delamination along the ion-implantation layer and so transfer the single-crystal semiconductor layer to the support substrate via the amorphous film, thus obtaining a bonded substrate including a single-crystal semiconductor layer on the amorphous film. The method may be changed, for instance, by combining or replacing a step of any one of the SmartCut method and the SiGen method as stated above and with a step in the other method. During bonding, adhesive may be used instead of the surface-activation treatment such as plasma treatment so as to bond the surface of the single-crystal semiconductor substrate to the surface of the amorphous film on the support substrate. For the bonded substrate, the single-crystal semiconductor substrate may be used as it is, or a thinned single-crystal semiconductor substrate may be used. A method for thinning the bonded substrate may be the method as stated above as well as polishing, etching or the like to have a single-crystal semiconductor layer of a desired thickness.

FIG. 1A to FIG. 1F show one example of an embodiment of the method for manufacturing a bonded substrate of the present invention. As shown in FIG. 1A, an amorphous film 2 is formed on all of the faces of a sintered-body substrate 1, so as to have a support substrate for bonding 3 including the amorphous film 2. As shown in FIG. 1B, ion implantation 6 is performed to a single-crystal semiconductor substrate 4 from the surface to be bonded to the support substrate for bonding 3, so as to form an ion-implantation layer 5 in the single-crystal semiconductor substrate 4. As shown in FIG. 1C and FIG. 1D, plasma treatment 7 is performed to the surface of the amorphous film of the support substrate for bonding 3 to be bonded to the single-crystal semiconductor substrate and the face of the single-crystal semiconductor substrate 4 from which ions have been implanted so as to activate the surfaces. As shown in FIG. 1E, the surfaces of the amorphous film of the support substrate for bonding 3 and the single-crystal semiconductor substrate 4 subjected to surface activation are bonded so as to obtain a bonded member 8. Mechanical impact is given to the ion-implantation layer 5 of the bonded member 8 using a wedge so as to cause delamination of a part 4b of the single-crystal semiconductor substrate along the ion-implantation layer 5 as shown in FIG. 1F, thus transferring a single-crystal semiconductor layer 4a on the sintered-body substrate 1 via the amorphous film 2 and obtaining a bonded substrate 9 including the single-crystal semiconductor layer 4a. In this way, a bonded substrate including a sintered-body substrate, at least one layer of amorphous film on all of the faces of the sintered-body substrate and a single-crystal semiconductor layer disposed on the amorphous film can be obtained.

EXAMPLES

The following describes the present invention in more details by way of examples. The following examples are just for illustration of the present invention, and do not limit the present invention.

Example 1

For a sintered-body substrate, a silicon nitride ($Si_3N_4$) sintered-body substrate of 200 mm in outer diameter and 725 μm in thickness was used. Measurement by two-terminal sensing showed that the volume resistivity of the sintered-body substrate used was $1.0 \times 10^{14}$ Ω·cm. The thermal conductivity thereof measured by a laser flash method at 25° C. and at atmospheric pressure was 100 W/m·K. Concentration of metal on the surface of the sintered-body substrate was evaluated by spraying a mist of a HF aqueous solution of 50% by mass to the surface of the sintered-body substrate, collecting the HF aqueous solution on the surface, and then measuring the concentration using a ICP-MS analyzer 3300DV (produced by Perkin Elmer company). The result showed that the metal types of Al, Fe and Ca had the concentration of $1.0 \times 10^{13}$ atoms/cm$^2$ or more, and the values of the concentration of Al, Fe and Ca were $5.0 \times 10^{13}$, $2.0 \times 10^{14}$, and $3.0 \times 10^{14}$ atoms/cm$^2$, respectively. Calculation by Expression (I) using the measurement result of thermal conductivity and thickness showed that the overall heat transfer coefficient of the sintered-body substrate used was $1.38 \times 10^5$ m$^2$·K/W.

Next, $Si_3N_4$ film was formed by a CVD method on all of the faces of the sintered-body substrate, i.e., the face to be bonded to the single-crystal semiconductor substrate, the rear face and the lateral faces, at atmospheric pressure, at 800° C. and under the mixture gas environment of $SiCl_2H_2$ and $NH_3$ ($SiCl_2H_2$:$NH_3$=1:20 in volume ratio). CMP was performed to the surface on which the $Si_3N_4$ film was formed using a polisher so that the thickness of the $Si_3N_4$ film was 0.3 μm. Thickness of the $Si_3N_4$ film was measured using a Si wafer as a monitor. That is, the film was formed on the Si wafer concurrently with the film formation of the $Si_3N_4$ film on the sintered-body substrate, and the thickness of the amorphous film on this Si wafer was measured using an interference-type film-thickness measuring instrument (produced by Nanometrics company, Nanospec 6100-KR).

Measurement using AFM (produced by Bruker AXS K.K., product No. NanoScope V/Dimension Icon) showed that the thus obtained $Si_3N_4$ film on the support substrate for bonding had surface roughness Rms of 0.18 nm, and the surface state thereof was smooth without any defects (including pits) that are insufficient in filling at the depressions. Concentration of metals on the surface of the $Si_3N_4$ film on the support substrate for bonding was evaluated by spraying mist of a HF aqueous solution of 50% by mass to the support substrate for bonding, collecting the HF aqueous solution on the surface, and then measuring the concentration using an ICP-MS analyzer 3300DV (produced by Perkin Elmer company). The result showed that the values of the concentration of Al, Fe and Ca were $1.0 \times 10^{10}$, $2.0 \times 10^{11}$, and $1.0 \times 10^{10}$ atoms/cm$^2$, respectively. Since the concentration of all metals was less than $5.0 \times 10^{11}$ atoms/cm$^2$, a substrate suitable for the process of manufacturing semiconductor devices can be formed.

Thermal conductivity of the $Si_3N_4$ film was measured using a Si wafer as a monitor. That is, the film was formed on the Si wafer concurrently with the film formation of the $Si_3N_4$ film on the sintered-body substrate, and the thermal conductivity of this Si wafer was measured using a thermo-physical property microscope (TM3 produced by Bethel Co., Ltd.). The measurement result was 4.0 W/m·K. Overall heat transfer coefficient in the direction perpendicular to the surface of the sintered-body substrate on which of the $Si_3N_4$ film was formed, i.e., in the thickness direction of the $Si_3N_4$ film was calculated based on 4.0 W/m·K as the thermal conductivity of the $Si_3N_4$ film and 0.3 μm of the film. The resultant was $1.37 \times 10^5$ m²·K/W. Based on this, overall heat transfer coefficient of the support substrate for bonding in the thickness direction of the $Si_3N_4$ film was 99.0% of the overall heat transfer coefficient of the sintered-body substrate in the thickness direction before forming the $Si_3N_4$ film.

For the single-crystal semiconductor substrate, a single-crystal silicon substrate of the same size as the sintered-body substrate was used. $H^+$ ions were implanted from the surface of the single-crystal silicon substrate under the conditions of the dose amount of $7.0 \times 10^{16}$ atom/cm² and the accelerating voltage of 70 keV. Surface activation treatment by plasma was performed to both of the surface of the $Si_3N_4$ film on the support substrate for bonding to be bonded with the single-crystal silicon substrate and the face of the single-crystal silicon substrate from which ions have been implanted. The surfaces of the $Si_3N_4$ film on the support substrate for bonding and of the single-crystal silicon substrate subjected to the surface activation treatment were bonded. The bonded substrate was heat-treated at 300° C. for 10 hours, whereby a bonded member was obtained. After that, mechanical impact was given to the ion-implantation layer of the bonded member using a blade so as to cause delamination of a part of the bonded member close to the single-crystal semiconductor substrate along the ion-implantation layer, whereby a bonded substrate including a single-crystal silicon layer on the $Si_3N_4$ film on the support substrate for bonding was obtained. Thickness of the single-crystal silicon layer of the obtained bonded substrate was 0.4 μm.

Table 1 shows the evaluation result of the bonded substrate. Observation of the surface of the single-crystal silicon layer of the bonded substrate using an ultrasonic microscope (produced by Hitachi Kenki FineTech Co., Ltd. Fine SAT FS2002) showed no voids and that the depressions of the surface of the sintered-body substrate were filled with the $Si_3N_4$ film and no gaps were generated at the bonding interface. Thermal conductivity of the bonded substrate was evaluated complying with ASTM5470 and using TIM Tester (Model 1400) produced by Anatech company. Specifically, a heating plate to which a thermocouple was attached was brought into contact with the surface of the bonded substrate close to the single-crystal silicon layer so that the temperature reached to 80° C., and the temperature of the surface close to the support substrate for bonding was measured. Thereby thermal conductivity of the bonded substrate in the thickness direction was calculated. The result shows that thermal conductivity of the bonded substrate was 48.1 W/m·K.

Example 2

A support substrate for bonding and a bonded substrate were manufactured and evaluated similarly to Example 1 other than that the $Si_3N_4$ film had a thickness of 3 μm. The $Si_3N_4$ film on the support substrate for bonding had surface roughness Rms of 0.13 nm, and the surface state thereof was smooth without any defects (including pits) that are insufficient in filling at the depressions. Since the concentration of Al, Fe and Ca on the surface of the $Si_3N_4$ film on the support substrate for bonding was $3.0 \times 10^9$ atoms/cm² or less that is the lower limit of the detection of this method, a substrate suitable for the process of manufacturing semiconductor devices can be formed. Overall heat transfer coefficient of the support substrate for bonding in the thickness direction of the $Si_3N_4$ film was $1.14 \times 10^5$ m²·K/W, which was 82.6% of the overall heat transfer coefficient of the sintered-body substrate before forming the $Si_3N_4$ film. Table 1 shows the evaluation result of the bonded substrate. It was confirmed that no voids were observed on the single-crystal silicon layer of the bonded substrate, and the depressions of the surface of the sintered-body substrate were filled with the $Si_3N_4$ film and no gaps were generated at the bonding interface. Thermal conductivity of the bonded substrate was 39.8 W/m·K.

Example 3

A support substrate for bonding and a bonded substrate were manufactured and evaluated similarly to Example 1 other than that a silicon nitride ($Si_3N_4$) sintered-body substrate of $1.0 \times 10^{14}$ Ω·cm in volume resistivity and 50 W/m·K in thermal conductivity, 200 mm in outer diameter, and 725 μm in thickness was used for the sintered-body substrate. Volume resistivity, thermal conductivity and metal concentration of this silicon nitride sintered-body substrate were measured by the same method as that in Example 1. The values of the concentration of Al, Fe and Ca of the surface of the sintered-body substrate used were $5.0 \times 10^{14}$, $3.0 \times 10^{12}$, and $1.0 \times 10^{13}$ atoms/cm², respectively. The $Si_3N_4$ film on the support substrate for bonding obtained had surface roughness Rms of 0.15 nm, and the surface state thereof was smooth without any defects (including pits) that are insufficient in filling at the depressions. Since the values of the concentration of Al, Fe and Ca on the surface of the $Si_3N_4$ film on the support substrate for bonding were $2.0 \times 10^{11}$, $1.0 \times 10^{10}$, and $3.0 \times 10^9$ atoms/cm² or less, a substrate suitable for the process of manufacturing semiconductor devices can be formed. Overall heat transfer coefficient of the support substrate for bonding in the thickness direction of the Si3N4 film was $0.69 \times 10^5$ m²·K/W, which was 99.5% of the overall heat transfer coefficient of the sintered-body substrate before forming the $Si_3N_4$ film. Table 1 shows the evaluation result of the bonded substrate. It was confirmed that no voids were observed on the single-crystal silicon layer of the bonded substrate, and the depressions of the surface of the sintered-body substrate were filled with the $Si_3N_4$ film and no gaps were generated at the bonding interface. Thermal conductivity of the bonded substrate was 20.0 W/m·K.

Example 4

A support substrate for bonding and a bonded substrate were manufactured and evaluated similarly to Example 1 other than that a $SiO_2$ film was formed on all of the faces of the sintered-body substrate by a CVD method at atmospheric pressure, at 600° C. and in the mixed gas atmosphere of $SiH_4$ and $O_2$ ($SiH_4:O_2=1:3$ in volume ratio), i.e., the surface to the bonded to the single-crystal semiconductor substrate, the rear face and the lateral faces, and CMP was performed using a polisher so that the thickness of the $SiO_2$ film was 0.3 μm. The obtained support substrate for bonding including the $SiO_2$ film had surface roughness Rms of 0.15 nm, and the surface state thereof was smooth without any defects (including pits) that are insufficient in filling at the depressions. Since the values of the concentration of Al, Fe and Ca on the surface of the $SiO_2$ film on the support substrate for bonding were $1.0\times10^{11}$, $3.0\times10^{11}$, and $6.0\times10^{10}$ atoms/cm$^2$, respectively, a substrate suitable for the process of manufacturing semiconductor devices can be formed. Overall heat transfer coefficient of the support substrate for bonding in the thickness direction of the $SiO_2$ film was $1.34\times10^5$ m$^2\cdot$K/W, which was 97.3% of the overall heat transfer coefficient of the sintered-body substrate before forming the $SiO_2$ film. Table 1 shows the evaluation result of the bonded substrate. It was confirmed that no voids were observed on the single-crystal silicon layer of the bonded substrate, and the depressions of the surface of the sintered-body substrate were filled with the $SiO_2$ film and no gaps were generated at the bonding interface. Thermal conductivity of the bonded substrate was 32.5 W/m·K.

Example 5

A support substrate for bonding and a bonded substrate were manufactured and evaluated similarly to Example 1 other than that a $SiO_2$ film of 3 μm was formed on all of the faces of the sintered-body substrate by a CVD method by the method similar to that of Example 4, a $Si_3N_4$ film of 0.5 μm was formed on the $SiO_2$ film, and CMP was performed using a polisher so that the thickness of the $Si_3N_4$ film was 0.3 μm. The amorphous film on the support substrate for bonding obtained had surface roughness Rms of 0.14 nm, and the surface state thereof was smooth without any defects (including pits) that are insufficient in filling at the depressions. Since the concentration of Al, Fe and Ca on the surface of the amorphous film on the support substrate for bonding was $3.0\times10^9$ atoms/cm$^2$ or less that is the lower limit of the detection of this method, a substrate suitable for the process of manufacturing semiconductor devices can be formed. Overall heat transfer coefficient of the support substrate for bonding in the thickness direction of the $SiO_2$ film and the $Si_3N_4$ film was $0.88\times10^5$ m$^2\cdot$K/W, which was 63.8% of the overall heat transfer coefficient of the sintered-body substrate before forming the $SiO_2$ film and the $Si_3N_4$ film. Table 1 shows the evaluation result of the bonded substrate. It was confirmed that no voids were observed on the single-crystal silicon layer of the bonded substrate, and the depressions of the surface of the sintered-body substrate were filled with the $SiO_2$ film and the $Si_3N_4$ film, and no gaps were generated at the bonding interface. Thermal conductivity of the bonded substrate was 33.6 W/m·K.

Comparative Example 1

A support substrate for bonding and a bonded substrate were manufactured and evaluated similarly to Example 1 other than that a $Si_3N_4$ film of 0.15 μm was formed on all of the faces of the sintered-body substrate by a CVD method, and CMP was performed using a polisher so that the thickness of the $Si_3N_4$ film was 0.10 μm. The obtained support substrate for bonding including the $Si_3N_4$ film had surface roughness Rms of 1.20 nm, and a large number of defects (including pits) were observed on the surface. The values of the concentration of Al, Fe and Ca of the surface of the $Si_3N_4$ film on the obtained support substrate for bonding were $4.0\times10^{13}$, $2.0\times10^{14}$, and $2.0\times10^{14}$ atoms/cm$^2$, respectively. Overall heat transfer coefficient of the support substrate for bonding in the thickness direction was $1.37\times10^5$ m$^2\cdot$K/W, which was 99.3% of the overall heat transfer coefficient of the sintered-body substrate before forming the $Si_3N_4$ film. Table 1 shows the evaluation result of the bonded substrate. It was confirmed that a large number of voids were observed on the single-crystal silicon layer of the bonded substrate, and the depressions of the surface of the sintered-body substrate were not sufficiently filled with the $Si_3N_4$ film and gaps were generated with the single-crystal silicon layer. Thermal conductivity of the bonded substrate was 51.3 W/m·K.

Comparative Example 2

A support substrate for bonding and a bonded substrate were manufactured and evaluated similarly to Example 4 other than that a $SiO_2$ film of 0.15 μm was formed on all of the faces of the support substrate for bonding by a CVD method, and CMP was performed using a polisher so that the thickness of the $SiO_2$ film was 0.1 μm. The $SiO_2$ film on the support substrate for bonding obtained had surface roughness Rms of 1.10 nm, and a large number of defects (including pits) were observed on the surface. The values of the concentration of Al, Fe and Ca of the surface of the $SiO_2$ film on the obtained support substrate for bonding were $4.2\times10^{13}$, $2.1\times10^{14}$, and $2.6\times10^{14}$ atoms/cm$^2$, respectively. Overall heat transfer coefficient of the support substrate for bonding in the thickness direction was $1.35\times10^5$ m$^2\cdot$K/W, which was 97.8% of the overall heat transfer coefficient of the sintered-body substrate before forming the $SiO_2$ film. Table 1 shows the evaluation result of the bonded substrate. It was confirmed that a large number of voids were observed on the single-crystal silicon layer of the bonded substrate, and the depressions of the surface of the sintered-body substrate were not sufficiently filled with the $SiO_2$ film and gaps were generated with the single-crystal silicon layer. Thermal conductivity of the bonded substrate was 50.5 W/m·K.

Comparative Example 3

A support substrate for bonding and a bonded substrate were manufactured and evaluated similarly to Example 3 other than that a $Si_3N_4$ film of 0.15 μm was formed on all of the faces of the sintered-body substrate by a CVD method, and CMP was performed using a polisher so that the thickness of the $Si_3N_4$ film was 0.10 μm. The $Si_3N_4$ film on the obtained support substrate for bonding had surface roughness Rms of 1.20 nm, and a large number of defects (including pits) were observed on the surface. The values of the concentration of Al, Fe and Ca of the surface of the $Si_3N_4$ film on the obtained support substrate for bonding were $4.0\times10^{14}$, $3.0\times10^{12}$, and $7.5\times10^{12}$ atoms/cm$^2$, respectively. Overall heat transfer coefficient of the support substrate for bonding in the thickness direction was $1.37\times10^5$ m$^2\cdot$K/W, which was 99.7% of the overall heat transfer coefficient of the sintered-body substrate before forming the $Si_3N_4$ film. Table 1 shows the evaluation result of the bonded substrate. It was confirmed that a large number of voids were observed on the single-crystal silicon layer of the bonded substrate, and the depressions of the surface of the sintered-body substrate were not sufficiently filled with the $Si_3N_4$ film and gaps were generated with the single-crystal silicon layer. Thermal conductivity of the bonded substrate was 28.1 W/m·K.

TABLE 1

| | Support substrate for bonding | | | | | |
|---|---|---|---|---|---|---|
| | Thickness of amorphous film (μm) | Surface roughness (nm) | Metal concentration (atoms/cm$^2$) | | | Bonded substrate |
| | | | Al | Fe | Ca | Voids |
| Ex. 1 | 0.3 | 0.18 | $1.0 \times 10^{10}$ | $2.0 \times 10^{11}$ | $1.0 \times 10^{10}$ | not found |
| Ex. 2 | 3.0 | 0.13 | $<3.0 \times 10^{9}$ | $<3.0 \times 10^{9}$ | $<3.0 \times 10^{9}$ | not found |
| Ex. 3 | 0.3 | 0.15 | $2.0 \times 10^{11}$ | $1.0 \times 10^{10}$ | $<3.0 \times 10^{9}$ | not found |
| Ex. 4 | 0.3 | 0.15 | $1.0 \times 10^{11}$ | $3.0 \times 10^{11}$ | $6.0 \times 10^{10}$ | not found |
| Ex. 5 | 3.3 | 0.14 | $<3.0 \times 10^{9}$ | $<3.0 \times 10^{9}$ | $<3.0 \times 10^{9}$ | not found |
| Comp. Ex. 1 | 0.1 | 1.20 | $4.0 \times 10^{13}$ | $2.0 \times 10^{14}$ | $2.0 \times 10^{14}$ | found |
| Comp. Ex. 2 | 0.1 | 1.10 | $4.2 \times 10^{13}$ | $2.1 \times 10^{14}$ | $2.6 \times 10^{14}$ | found |
| Comp. Ex. 3 | 0.1 | 1.20 | $4.0 \times 10^{14}$ | $3.0 \times 10^{12}$ | $7.5 \times 10^{12}$ | found |

The examples illustrate a bonded substrate including a single-crystal silicon layer, which can be applied to bonding to a substrate including a device layer formed in a single-crystal silicon substrate or to a substrate for transferring. When a support substrate for bonding of the present invention is used for bonding to a wafer including a device layer formed therein, bonding may be performed directly with the single-crystal semiconductor substrate or may be performed using adhesive. When the bonding is performed via adhesive, the thickness of the adhesive layer can be made thinner and so heat dissipation capacity can be increased because the surface of the amorphous film on the support substrate for bonding has fewer defects, such as pits. The examples illustrate a silicon nitride sintered-body substrate, and the present invention is applicable to another substrate having a coefficient of thermal expansion closer to that of silicon, such as aluminum nitride or sialon. A coefficient of thermal expansion of the support substrate that is $5 \times 10^{-6}/°$ C. or less can reduce warpage of the substrate after bonding even when bonding is performed directly with a single-crystal semiconductor substrate or via adhesive. This can facilitate an increase in size of the bonded substrate or back grinding after bonding with a device wafer.

DESCRIPTION OF REFERENCE NUMERALS

1: sintered-body substrate
2: amorphous film
3: support substrate for bonding
4: single-crystal semiconductor substrate
4a: single-crystal semiconductor layer
4b: delaminated single-crystal semiconductor substrate
5: ion-implanted layer
6: ion-implantation
7: plasma treatment
8: bonded member
9: bonded substrate including single-crystal semiconductor layer

The invention claimed is:

1. A support substrate for bonding, comprising a sintered-body substrate and at least one layer of amorphous film disposed on all faces of the sintered-body substrate, wherein on a surface of the amorphous film, concentration of each of Al, Fe and Ca measured by an Inductively Coupled Plasma-Mass Spectrometry (ICP-MS) method is less than $5.0 \times 10^{11}$ atoms/cm$^2$, and surface roughness (Rms) of the surface of the amorphous film is 0.2 nm or less.

2. The support substrate for bonding according to claim 1, wherein a type and thickness of the amorphous film are selected so that a reciprocal (1/overall heat transfer coefficient) of overall heat transfer coefficient in a thickness direction of the amorphous film is 50 to 98% of a reciprocal of overall heat transfer coefficient of the sintered-body substrate in a thickness direction thereof without the amorphous film, wherein the type of the amorphous film is selected from $SiO_2$, $Si_3N_4$, $SiO_xN_y$ (x and y are numbers satisfying $0<x<2.0$, $0<y<1.3$), amorphous silicon, and polysilicon.

3. The support substrate for bonding according to claim 1, wherein the sintered-body substrate has thermal conductivity of 5.0 W/m·K or more, volume resistivity of $1.0 \times 10^8$ Ω·cm or more and a linear coefficient of thermal expansion of $5.0 \times 10^{-6}/°$ C. or less.

4. The support substrate for bonding according to claim 1, wherein the amorphous film has a thickness exceeding 0.1 μm and less than 10 μm.

5. The support substrate for bonding according to claim 1, wherein the amorphous film comprises $Si_3N_4$, and has a thickness exceeding 0.1 μm and being 1 μm or less.

6. The support substrate for bonding according to claim 1, wherein the sintered-body substrate comprises silicon nitride, aluminum nitride or SiAlON (sialon).

7. A bonded substrate, comprising: a sintered-body substrate; at least one layer of amorphous film disposed on all faces of the sintered-body substrate; and a single-crystal semiconductor layer disposed on a portion of the amorphous film,
wherein on a surface of the amorphous film on which the single-crystal semiconductor layer is disposed, concentration of each of Al, Fe and Ca measured by an Inductively Coupled Plasma-Mass Spectrometry (ICP-MS) method is less than $5.0 \times 10^{11}$ atoms/cm$^2$, and surface roughness (Rms) of the surface of the amorphous film is 0.2 nm or less.

* * * * *